(12) United States Patent
Soda

(10) Patent No.: US 7,049,888 B2
(45) Date of Patent: May 23, 2006

(54) ACTIVE INDUCTANCE CIRCUIT AND DIFFERENTIAL AMPLIFIER CIRCUIT

(75) Inventor: Masaaki Soda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/838,221

(22) Filed: May 5, 2004

(65) Prior Publication Data
US 2004/0227573 A1    Nov. 18, 2004

(30) Foreign Application Priority Data
May 15, 2003    (JP) ............................. 2003-136793

(51) Int. Cl.
H03F 3/45    (2006.01)
H03H 11/00    (2006.01)

(52) U.S. Cl. ...................................... 330/253; 333/214
(58) Field of Classification Search ................ 333/213, 333/214, 215
See application file for complete search history.

(56) References Cited

U.S. PATENT DOCUMENTS 6,515,560 B1 * 2/2003 Adan .......................... 333/214
6,809,616 B1 * 10/2004 Liu et al. .................... 333/214
6,825,722 B1 * 11/2004 Segawa ....................... 330/254

FOREIGN PATENT DOCUMENTS

JP        2001-251164        9/2001

* cited by examiner

Primary Examiner—Steven J. Mottola
(74) Attorney, Agent, or Firm—McGinn IP Law Group, PLLC

(57) ABSTRACT

An active inductance circuit comprising a signal terminal (OUT) and having voltage and current characteristics, as viewed from this terminal, which are identical to those of a circuit comprising an inductance, this active inductance circuit having a structure in which the drain terminal of a first MOS transistor M1 and the gate terminal of a second MOS transistor M2 different in conductivity type from the first MOS transistor are connected to the signal terminal, the gate terminal of the first MOS transistor is connected to the source terminal of the second MOS transistor, a capacitor and a current source are connected to the source terminal of the second transistor, the source terminal of the first MOS transistor and the drain terminal of the second MOS transistor are connected to a power source and other terminals of the capacitor and current source are connected to another power source.

14 Claims, 6 Drawing Sheets

PRIOR ART

ACTIVE INDUCTANCE CIRCUIT AND DIFFERENTIAL AMPLIFIER CIRCUIT

BACKGROUND OF THE INVENTION

1. Field of the Invention

The present invention relates to an active inductance circuit having transistors and a capacitor and operating as an inductance and to a differential amplifier circuit having the circuit.

2. Description of the Related Art

Inductances have been widely used with the object of extending an amplification band and compensating transmission characteristics in high-speed communication circuits. However, an inductance located in a chip fabricated by using wiring layers requires a large surface area even in the case of a small inductance value. As a result, cost is raised due to increase in the chip size, and logic that can be carried on the chip is decreased. To overcome this problem, active inductance circuits in which active elements such as transistors and passive elements such as capacitors are combined to have characteristics equivalent to an inductance have been suggested An example of such an active inductance circuit is disclosed in Japanese Unexamined Patent Application Publication No. 2001-251164. FIG. 11 shows a configuration of the active inductance circuit. This circuit has a first differential circuit, a differential integrator, and a second differential pair. In the first differential circuit, input signal voltage terminals Vi are taken to be between the gate terminals of MOS transistors 41a and 41b. The differential integrator is constituted by MOS transistors 40a and 40b in which a capacitor 43 is connected between the drain terminals and each of those drain terminals is connected to each of the source terminals of the MOS transistors 41a and 41b. Further, the differential integrator has a third differential pair in which drains serve as output signal voltage terminals.

Further, in the differential integrator, the gate terminals of MOS transistors 40a and 40b are connected to drain terminals of MOS transistors 40b and 40a, respectively. The source terminals of MOS transistors 40a and 40b are commonly connected and grounded via a first current source 45. The second differential pair is composed of MOS transistors 42a and 42b in which the gate terminals are connected to drain terminals of MOS transistors 40a and 40b constituting the third differential pair and the drain terminals are connected to input signal voltage terminals.

In this conventional example, the impedance ($Z_{in}$), as viewed from the input terminals, is represented by $$Z_{in}=V_{in}/I_{in}=sC/(g_m{}^*g_m)$$

and is equivalent to an inductance, as viewed from the input terminals. In this conventional example, the active inductance is constituted by three MOS transistors per one differential channel, that is, a total of six transistors.

As mentioned hereinabove, the conventional active inductance requires a total of six elements for a differential circuit. Thus, in high-frequency applications, parasitic capacitances of three MOS in each channel of the differential circuit are generated, thereby degrading the high-frequency characteristic. Furthermore, when an amplification circuit is composed by employing this active inductance as a load, because a bias current flows from Vi in the input direction, drain terminals of a differential pair composed of PMOS have to be connected to the input terminal Vi.

In this case, the gate-source voltage of MOS transistors 41a and 41b, the gate-source voltage of MOS transistors 40a and 40b, and the voltage drop component of the current source 45 are added to the voltage drop of the conventional active inductance used as a load, even when the lowest values are assumed. As a result, the voltage drop in the conventional active inductance is large, and thus it is difficult to make a transition to low-voltage operation when an amplifier is composed by using such a conventional example.

SUMMARY OF THE INVENTION

With the foregoing in view, it is an object of the present invention to provide an active inductance circuit with reduced number of elements. It is another object of the present invention to provide an active inductance circuit in which degradation of frequency characteristic can be controlled. It is yet another object of the present invention to provide an active inductance circuit that has a small voltage drop which is advantageous for low-voltage operation.

To these ends, according to one aspect of the present invention, there is provided an active inductance circuit in which voltage and current characteristics at an output terminal represent characteristics of the circuit including inductance, including a first transistor having a control terminal, a first signal terminal, and a second signal terminal; a second transistor different in conductivity type from the first transistor, having a control terminal, a first signal terminal, and a second signal terminal; a capacitor; and a current source, wherein the first signal terminal of the first transistor is connected to the output terminal; the control terminal of the second transistor is connected to the first signal terminal of the first transistor; the control terminal of the first transistor is connected to the second signal terminal of the second transistor; and the second signal terminal of the second transistor is connected to a terminal of the current source and a terminal of the capacitor. This configuration enables an active inductance circuit with reduced number of elements. A connection of these elements is not limited to a direct connection, and various electrical connections, including a connection containing impedance, may be used within the range of operation as an active inductance circuit.

In the above aspect of this invention, it is preferred that the first and second transistors are MOS transistors, the control terminal is a gate terminal, the first terminal is a drain terminal, and the second terminal is a source terminal so as to improve frequency characteristics and reduce power consumption.

In the above aspect of this invention, the first transistor may be a PMOS transistor and the second transistor may be an NMOS transistor. Alternatively, the first transistor may be an NMOS transistor and the second transistor may be an PMOS transistor.

In the above aspect of this invention, it is preferred that the second signal terminal of the first transistor and the first signal terminal of the second transistor are connected to a first power source, and another terminal of the current source and another terminal of the capacitor are connected to a second power source.

In the above aspect of this invention, the active inductance circuit may further include a second capacitor connected in parallel with the first transistor. This allows the circuit to have resonance characteristics in a specific frequency, enabling to form a bandpass filter, for example.

In the above aspect of this invention, the capacitor may be a variable capacitor controlled with a control signal. This allows control of impedance characteristics. Also in the above aspect of this invention, an electric current value of the current source may be controlled with a control signal. This allows control of impedance characteristics.

According to another aspect of the present invention, there is provided a differential amplifier circuit including a first active inductance circuit; a second active inductance circuit; and a differential pair having a first transistor and a second transistor; wherein control terminals of the first and second transistors are input terminals for differential signals, output terminals of the first and second active inductance circuits are connected to first signal terminals of the first and second transistors respectively; the first signal terminals of the first and second transistors are differential signal output terminals, second signal terminals of the first and second transistors are connected to a current source, each of the first and second active inductance circuits has a third transistor having a control terminal, a first signal terminal, and a second signal terminal; a fourth transistor different in conductivity type from the third transistor, having a control terminal, a first signal terminal, and a second signal terminal; a capacitor; and a second current source, the first signal terminal of the third transistor is connected to an output terminal, the control terminal of the fourth transistor is connected to the first signal terminal of the third transistor, the control terminal of the third transistor is connected to the second signal terminal of the fourth transistor, and the second signal terminal of the fourth transistor is connected to a terminal of the second current source and a terminal of the capacitor. This configuration enables a differential amplifier having an active conductor with reduced number of elements.

In the above aspect of this invention, the first, second, third, and fourth transistors may be MOS transistors, the control terminal may be a gate terminal, the first terminal may be a drain terminal, and the second terminal may be a source terminal.

In the above aspect of this invention, the current source may have a third current source connected to the source terminal of the first transistor and a fourth current source connected to the source terminal of the second transistor; and an impedance element may be connected between the source terminals of the first and second transistors. The impedance element is preferably constituted by a capacitor. This can suppress a gain in a low-pressure region, enabling to form a high-pass amplifier, for example. Further, each of the first and second active inductance circuits may have a third capacitor connected in parallel with the third transistor. This enables to form a bandpass amplifier, for example.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

The preferred embodiments of the present invention will be described hereinbelow. The explanation provided hereinbelow merely illustrates the embodiments of the present invention, and the present invention is not limited to the below-described embodiments. The description hereinbelow is appropriately shortened and simplified to clarify the explanation. A person skilled in the art will be able to easily change, add, or modify various elements of the below-described embodiments, without departing from the scope of the present invention. In the figures, the identical reference symbols denote identical structural elements and the redundant explanation thereof is omitted.

First Embodiment

Figure 1:
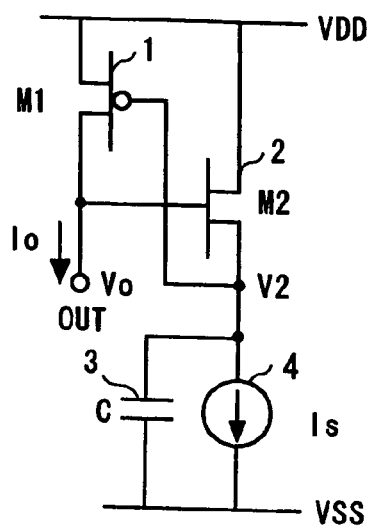
FIGS. 1 and 1A are circuit diagrams illustrating the configuration of an active inductance circuit according to the first embodiment of the present invention.

FIG. 1 shows the first embodiment of the active inductance circuit in accordance with the present invention. In FIG. 1, the source of a P-type MOS transistor M1(1) is connected to a high-voltage power source VDD and the drain is connected to an output terminal OUT. The drain of an N-type MOS transistor M2(2) is connected to the VDD directly or via an element for protection against surge. The source of the N-type MOS transistor M2(2) is connected to a current source 4. The gate of the N-type MOS transistor M2(2) is connected to the drain of the P-type MOS transistor M1(1) or to the output terminal OUT, thereby forming a source follower circuit.

The current source 4 is connected to a low-voltage power source VSS. The gate of the MOS transistor M1(1) and a capacitor 3 are connected to the source of the NMOS transistor M2(2). The other terminal of the capacitor 3 is connected to the VSS. The capacitor 3 and current source 4 are connected in parallel between the source of the NMOS transistor M2(2) and the low-voltage power source VSS. In the output terminal OUT of this circuit, changes in the ratio of the output current $I_{out}$ to the output voltage $V_{out}$ with respect to frequency are equivalent to an inductance.

The operation characteristics of this circuit will be explained below by using mathematical formulas. First, we will explain that the PMOS transistor M1(1) necessarily operates in a linear region (triode region) of MOS transistor. The gate-source voltage $V_{gs,M1}$ of the PMOS transistor M1(1) is represented by the following formula:

$$V_{gs,M1} = V_{ds,M1} + V_{gs,M2} = V_{ds,M1} + V_{th,M2} + (V_{gs,M2} - V_{th,M2}) \quad (1)$$

Here, $V_{ds}$ is a drain-source voltage of the MOS transistor, $V_{th}$ is a threshold voltage of the MOS transistor. Here, if the threshold voltages $V_{th}$ of the PMOS transistor M1(1) and NMOS transistor M2(2) are considered to be almost equal and $V_{th,M2}$ of the second term in the right side of Formula (1) is replaced with $V_{th,M1}$, then formula (1) becomes:

$$V_{gs,M1} - V_{th,M1} = V_{ds,M1} + (V_{gs,M2} - V_{th,M2}) \quad (2)$$

In the NMOS transistor M2(2), a bias current flows due to the presence of the current source 4. As a result, the term in the parentheses in Formula (2) is necessarily more than zero. Thus, $$V_{gs,M1} - V_{th,M1} > V_{ds,M1} \quad (3)$$

and the PMOS transistor M1(1) operates in a linear region.

When the NMOS transistor M2(2) is operated at a high speed, a large current typically flows. As a result, the value in the parentheses in formula (2) is increased. Thus, the following relationship is valid:

$$2*(V_{gs,M1} - V_{th,M1}) >> V_{ds,M1} \quad (4)$$

In this case, the current-voltage characteristic of the PMOS transistor M1(1) is represented by the following formula.

$$I_{d,M1} = \mu_p C_{ox} W/L * (V_{gs,M1} - V_{th,M1}) * V_{ds,M1} \quad (5)$$

Here $\mu$ is electron mobility, $C_{ox}$ is the oxide film thickness of MOS, W is a gate width, and L is a gate length.

The operation of the circuit of the present embodiment as an inductance will be explained below. If the gate-source voltage $V_{gs,M1}$ and drain-source voltage $V_{ds,M1}$ of the PMOS transistor M1(1) are slightly changed, the drain current becomes:

$$\Delta I_{d,M1} = \frac{\partial I_{d,M1}}{\partial V_{gs,M1}} \Delta V_{gs,M1} + \frac{\partial I_{d,M1}}{\partial V_{ds,M1}} \Delta V_{ds,M1} = \quad (6)$$
$$\mu_p C_{ox} W/L \{V_{dso,M1} \Delta V_{gs,M1} + (V_{gso,M1} - V_{th,M1}) \Delta V_{ds,M1}\}$$

Because the NMOS transistor M2(2) operates in a saturation region, the drain current characteristic of the NMOS transistor M2(2) relating to a low-amplitude signal becomes as follows:

$$\Delta I_{d,M2} = g_{m,M2} \Delta V_{gs,M2} = g_{m,M2}(-\Delta V_{ds,M1} + \Delta V_{gs,M1}) \quad (7)$$

$g_{m,M2}$ is a trans-conductance of the NMOS transistor M2(2).

Due to capacitor 3, $V_{gs,M1}$ changes as the following voltage.

$$\Delta V_{gs,M1} = \frac{-\Delta I_{d,M2}}{sC} = \frac{g_{m,M2}}{sC}(\Delta V_{ds,M1} - \Delta V_{gs,M1}) \quad (8)$$

Here, s is a Laplacian. Rearranging formula (8), we obtain $$\therefore \Delta V_{gs,M1} = \frac{g_{m,M2}/sC}{1 + g_{m,M2}/sC} \Delta V_{ds,M1} = \frac{1}{1 + sC/g_{m,M2}} \Delta V_{ds,M1} \quad (9)$$

Substituting this formula to formula (6), we obtain $$\Delta I_{d,M1} = \mu_p C_{ox} W/L \left\{ \frac{V_{dso,M1}}{1 + sC/g_{m,M2}} \Delta V_{ds,M1} + (V_{gso,M1} - V_{th}) \Delta V_{ds,M1} \right\} \quad (10)$$

Thus, the impedance Z, as viewed from the terminal Io, can be represented as $$Z = \frac{\Delta V_{ds,M1}}{\Delta I_{d,M1}} = \frac{1}{\mu_p C_{ox} W/L} * \frac{1}{V_{gso,M1} - V_{th} + V_{dso,M1}} * \quad (11)$$
$$\frac{1 + sC/g_{m,M2}}{1 + sC/g_{m,M2} * (V_{gso,M1} - V_{th})/(V_{gso,M1} - V_{th} + V_{dso,M1})}$$

Figure 2:
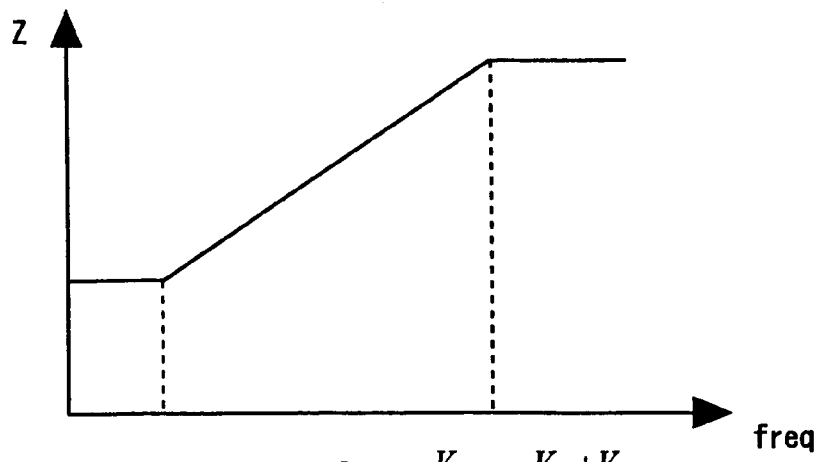
FIG. 2 is a graph showing the frequency characteristic of the active inductance circuit according to the first embodiment of the present invention.

Thus, as shown in FIG. 2, it is clear that an impedance characteristic is demonstrated such that the impedance increases with the increase in frequency, from a zero point to an extremal value in Formula (11). In the graph shown in FIG. 2, frequency is plotted against the X axis and impedance is plotted against the Y axis.

In this way, in the circuit of the present embodiment, only two transistors are used or only four transistors are used when the circuit is employed as a load of a differential circuit. Thus, the number of elements is small and the circuit can operate up to an accordingly high value. In other words, in the present embodiment, a circuit functioning as an inductance is constituted by two transistors, a capacitor, and a current source. Thus, the number of transistors is less than in the conventional circuit, the parasitic capacitance of transistors which hinders high-speed operation is reduced and the circuit can operate at a higher speed.

On the other hand, when the circuit of the present embodiment is connected as a load, the voltage drop on the load is merely the source-drain voltage of operation in the linear region of the PMOS transistor M1(1). As a result, the voltage drop is small and low-voltage operation is possible. In other words, in the present embodiment, the voltage drop on the signal terminals and power source terminals is determined by the drain-source voltage of the transistor serving as a load. Furthermore, because the transistor operates in a linear region, it can operate at a lower voltage.

Figure 1A:
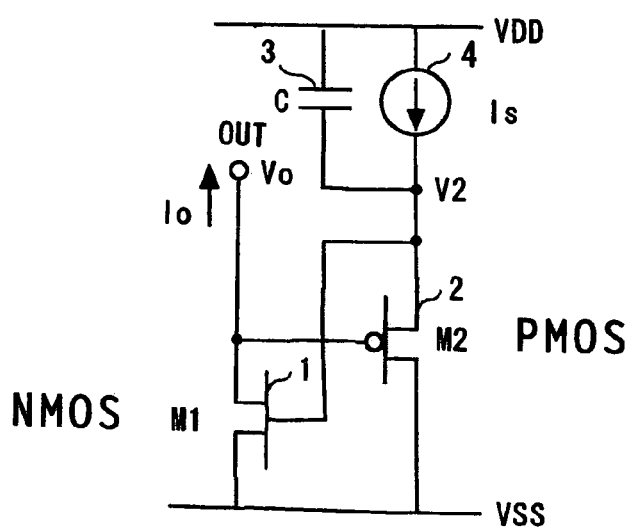

It will be readily understood that, as shown in FIG. 1A, the first MOS transistor M1 can be constituted by an NMOS transistor, and the second MOS transistor M2 can be constituted by a PMOS transistor by changing appropriately the connection with the power source. Alternatively, the active conductance circuit in accordance with the present invention can be composed by using bipolar transistors. Circuit elements can be connected directly, as shown in FIG. 1, or via an impedance. Necessary circuit elements can be added by design, within a range in which the circuit functions as an active conductance. Those assertions are also valid for the below-described embodiments.

Second Embodiment

Figure 3:
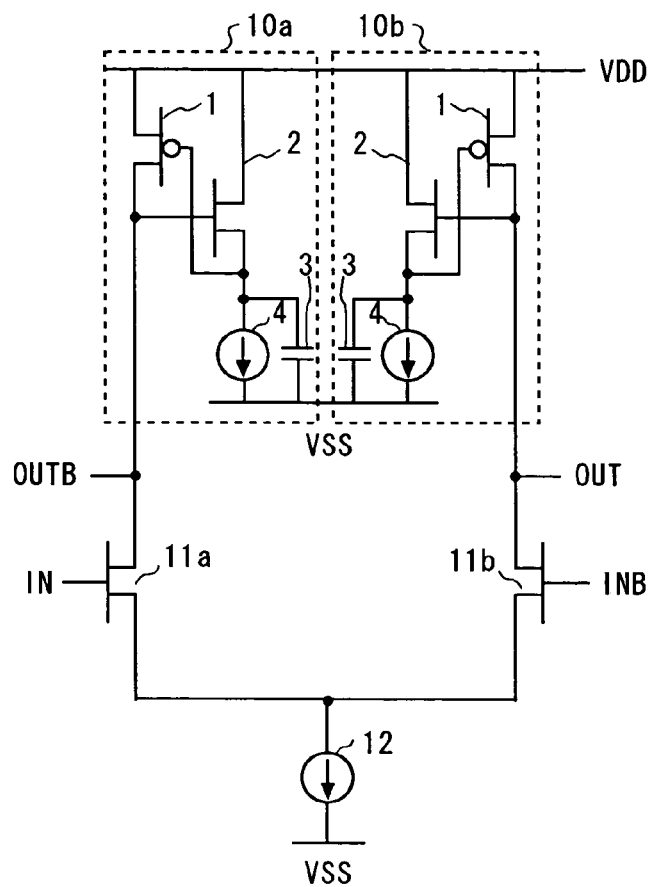
FIG. 3 is a circuit diagram illustrating the configuration of a differential amplifier circuit using an active inductance circuit as a load according to the second embodiment of the present invention.

FIG. 3 is a circuit diagram illustrating the configuration of the differential amplifier circuit of the second embodiment. Referring to FIG. 3, NMOS transistors 11a and 11b constitute a differential pair and are commonly connected at the source side and connected to a current source 12. The current source 12 is connected to a low-voltage power source VSS. Gates of the NMOS transistors 11a and 11b are connected to input terminals IN and INB. The active inductors 10a and 10b that have been explained with reference to FIG. 1 are connected to drains of NMOS transistors 11a and 11b, respectively. Drains of PMOS transistors M2(2) of respective active inductors 10a and 10b are connected to respective drains of NMOS transistors 11a and 11b.

In other words, the drains of NMOS transistors 11a and 11b are connected to respective output terminals of the active inductors 10a and 10b, the nodes are connected to output terminals OUTB and OUT, and signals are outputted. The IN and OUTB are in the same phase, and the INB and OUT are in the same phase. Thus, using the active inductors 10a and 10b as loads makes it possible to obtain an amplifier having a peaking characteristic with a higher amplification ratio in a high region. The circuit of the present embodiment is constituted by three circuits connected in series, including the current source 12. Thus, a circuit capable of operating at a low voltage such that the power source voltage is 1.2 V can be obtained.

Figure 4:
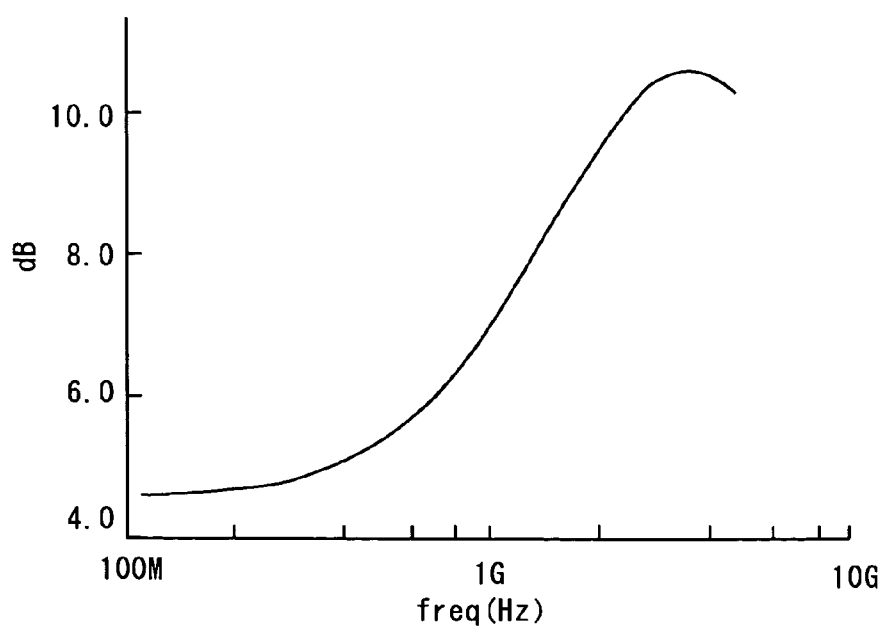
FIG. 4 is a graph showing the frequency characteristic of the differential amplifier circuit according to the second embodiment of the present invention.

FIG. 4 shows an example of the amplification ratio vs. frequency relation of the differential amplifier circuit of the present embodiment. Amplification ratio is plotted against the Y axis, and frequency is plotted against the X axis. In the active inductance circuit of the present embodiment, the amplification ratio in the vicinity of 4 GHz is 11 dB, and an amplifier can be realized which has a peaking characteristic of 6 db, as compared with a gain in a low region of 100 MHz or less. For example, a peaking amplifier capable of amplification up to 5 GHz at a power source voltage of 1.5 V can be obtained.

It will be readily apparent that a differential pair can be composed by using PMOS transistors by changing the connection relation. In this case, the conductivity type of each transistor in the active conductance is typically inversed with respect to that shown in FIG. 3. Alternatively, a differential amplifier circuit can be composed by using bipolar transistors. Those assertions are also valid for the below-described embodiments.

Third Embodiment

Figure 5:
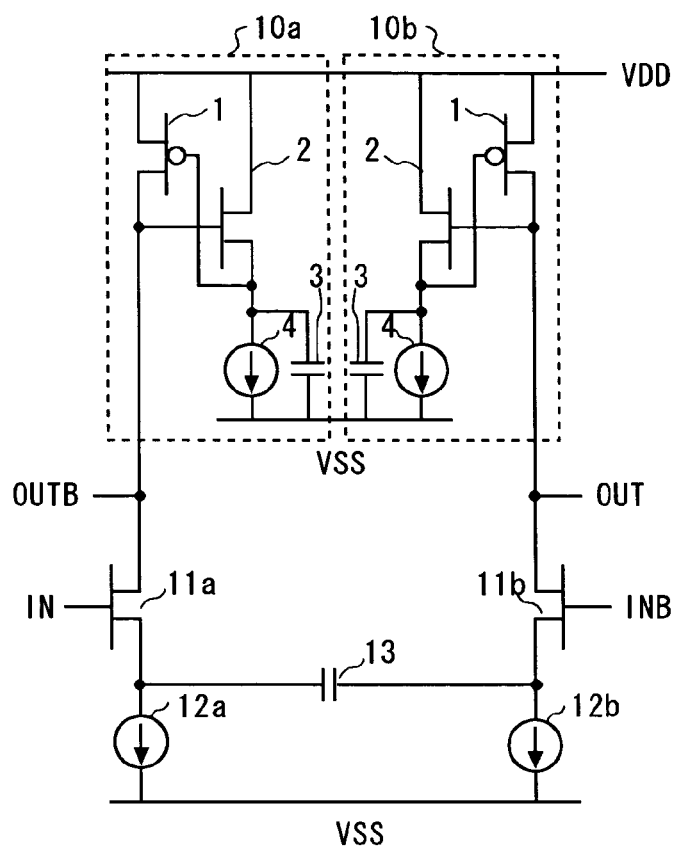
FIG. 5 is a circuit diagram illustrating the configuration of a differential high-pass amplifier circuit using an active inductance circuit according to the third embodiment of the present invention.

FIG. 5 is a circuit diagram illustrating the configuration of the differential high-pass amplifier circuit of the third embodiment. Referring to FIG. 5, NMOS transistors 11a and 11b constitute a differential pair, and current sources 12a and 12b are connected to respective sources of NMOS transistors 11a and 11b. The current sources 12a and 12b are connected to a low-voltage power source VSS. Further, a capacitor 13 is connected between the sources of NMOS transistors 11a and 11b. The active inductors 10a and 10b that have been explained with reference to FIG. 1 are connected to drains of NMOS transistors 11a and 11b, respectively.

The connection mode of active inductors 10a and 10b and NMOS transistors 11a and 11b is identical to that of the second embodiment. Using such a circuit configuration makes it possible to realize a high-pass amplifier in which a gain in a low-frequency region is further suppressed. A resistor can be used as impedance instead of the capacitor 13. Alternatively, a resistor and a capacitor can be connected in series between the sources of NMOS transistors 11a and 11b.

Figure 6:
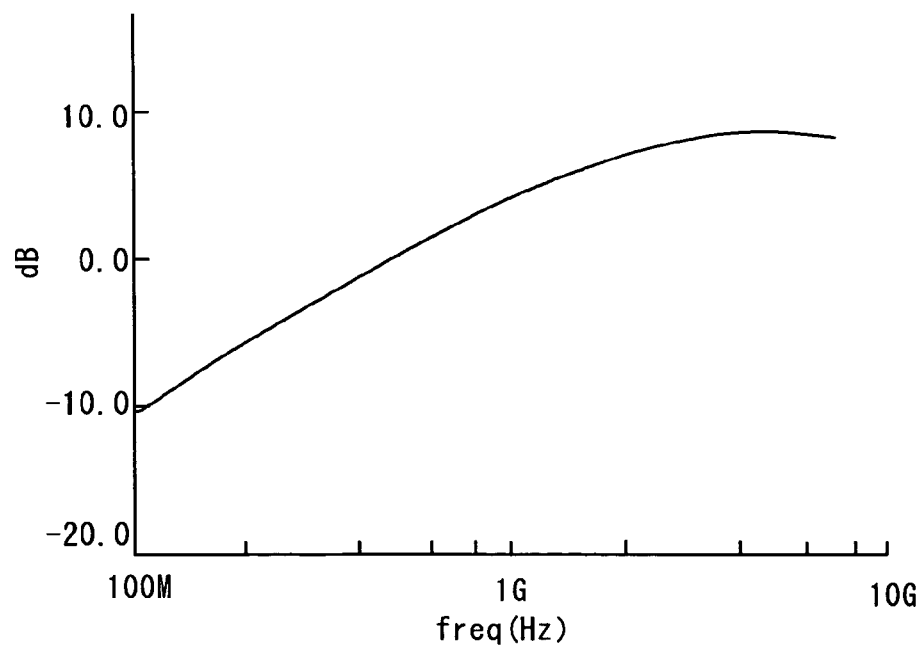
FIG. 6 is a graph showing the frequency characteristic of the high-pass amplifier according to the third embodiment of the present invention.

FIG. 6 shows an example of the amplification ratio vs. frequency relation of the differential high-pass amplifier circuit of the third embodiment. Amplification ratio is plotted against the Y axis, and frequency is plotted against the X axis. Using the circuit of the present embodiment makes it possible to realize a differential high-pass amplifier circuit in which a gain in a low-frequency region of 100 MHz is −10 dB, but a gain in a high-frequency region of 4 GHz is 10 dB. Because the difference in gain between a low-frequency region and a high-frequency region is 20 dB or more, using the circuit of the present embodiment makes it possible to obtain a high-pass amplifier circuit with good characteristic.

Fourth Embodiment

Figure 7:
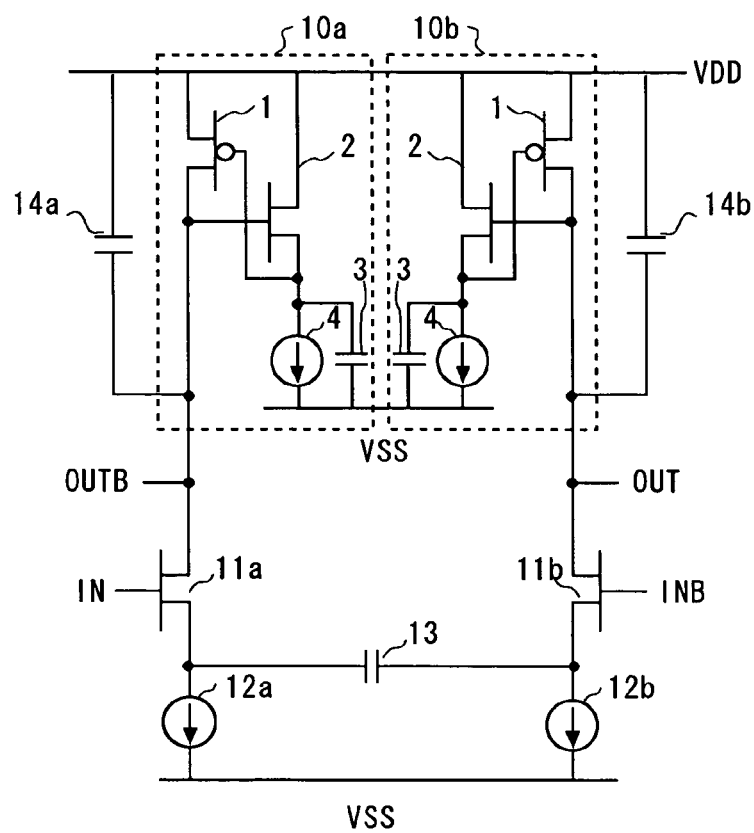
FIG. 7 is a circuit diagram illustrating the configuration of a bandpass filter circuit using an active inductance circuit according to the fourth embodiment of the present invention.

FIG. 7 is a circuit diagram illustrating the configuration of the bandpass filter circuit of the fourth embodiment. In the bandpass filter circuit of the present embodiment, in addition to the circuit configuration of the third embodiment explained with reference to FIG. 5, the capacitors 14a and 14b are connected in parallel with respective PMOS transistors M1(1) of active inductors 10a and 10b. In other words, the capacitors 14a and 14b are connected at one terminal thereof to a power source VDD or to the sources of the PMOS transistors M1(1) via the VDD. The other terminals of capacitors 14a and 14b are connected to drains of PMOS transistors M1(1) of active inductors 10a and 10b. Connecting the capacitors 14a and 14b in parallel to the active inductors 10a and 10b provides the circuit with a resonance frequency and allows the circuit of the present embodiment to have a characteristic identical to that of the bandpass filter circuit.

Figure 8:
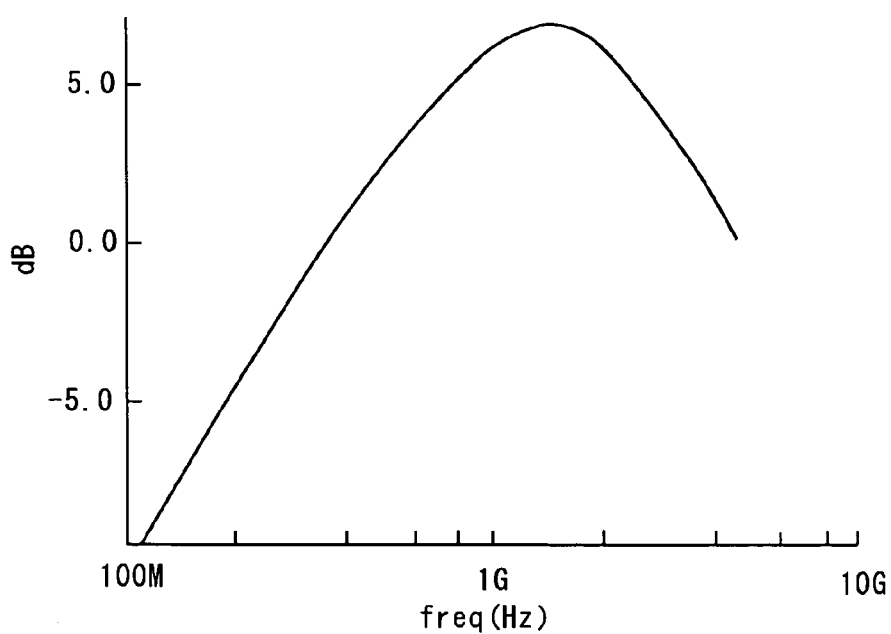
FIG. 8 is a graph showing the frequency characteristic of the bandpass filter circuit according to the fourth embodiment of the present invention.

FIG. 8 shows an example of the amplification ratio vs. frequency relation of the bandpass filter circuit of the fourth embodiment. Amplification ratio is plotted against the Y axis, and frequency is plotted against the X axis. Connecting the ccapacitors in parallel with active inductors in accordance with the present invention, as shown in the circuit configuration of the present embodiment, makes it possible to realize a bandpass filter circuit having a bandpass characteristic with a resonance point in the vicinity of 1.5 GHz. With the circuit configuration of the present embodiment, a bandpass filter circuit can be realized without employing an inductance using a wiring layer.

Fifth Embodiment

Figure 9:
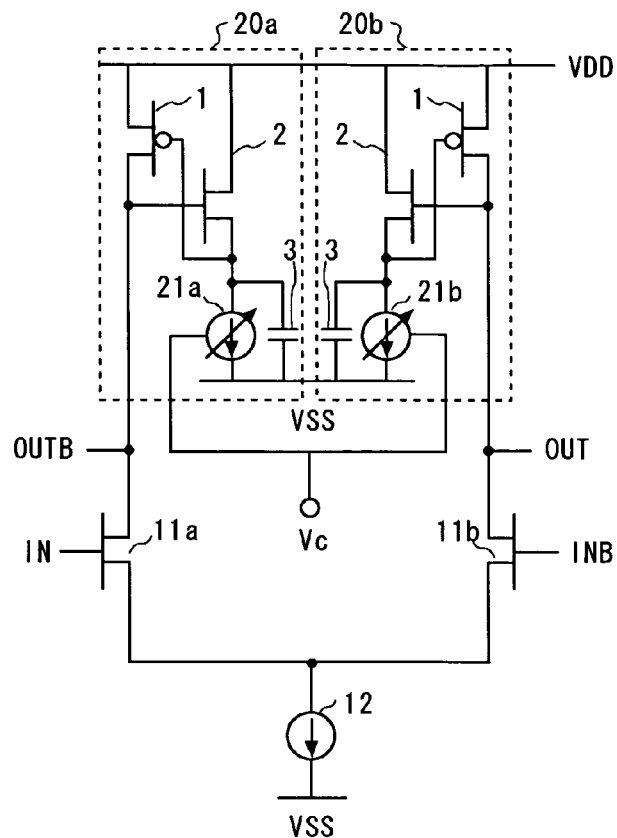
FIG. 9 is a circuit diagram illustrating the configuration of a differential amplifier circuit using an active inductance circuit with variable inductance value as a load according to the fifth embodiment of the present invention.

FIG. 9 is a circuit diagram illustrating the configuration of the differential amplifier circuit of the fifth embodiment. In the differential amplifier circuit of the present embodiment, the two current sources 4 in the active conductors 10a and 10b of the differential amplifier circuit of the second embodiment that has been explained with reference to FIG. 3 are replaced with variable current sources 20a and 20b. The variable current sources 20a and 20b are connected to a control terminal Vc for inputting a control signal. Changing current values of variable current sources 20a and 20b changes $g_{m,M2}$ of formula (11) and the impedance characteristic of active inductors 10a and 10b.

Controlling the variable current sources 20a and 20b by the control signal makes it possible to control the impedance characteristic of active inductors 10a and 10b. For example, employing multistage connection of the differential amplifier circuits of the present embodiment makes it possible to obtain a ring oscillator. Applying adequate control signals to the control terminal Vc of variable current sources 20a and 20b makes it possible to realize a VCO (Voltage Controlled Oscillator) with good high-frequency characteristic.

Sixth Embodiment

Figure 10:
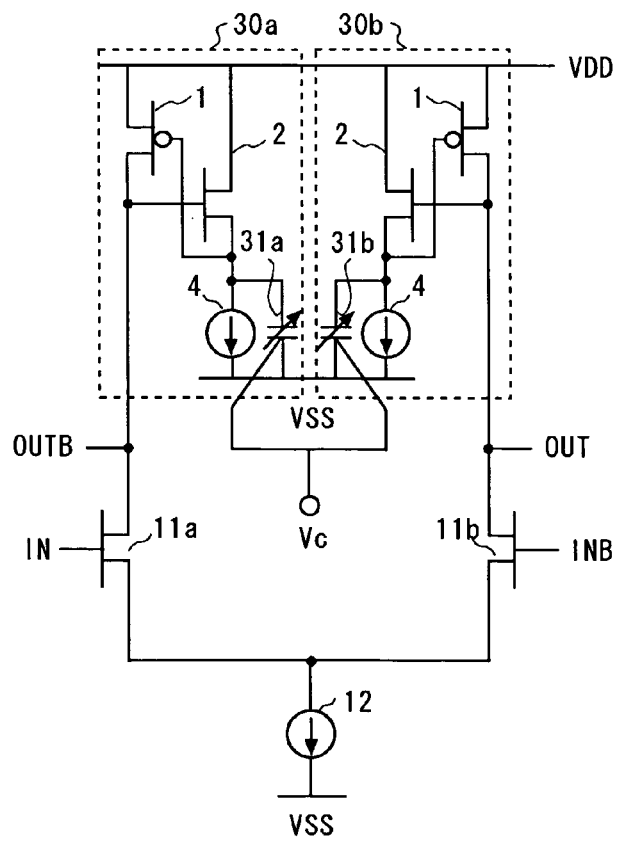
FIG. 10 is a circuit diagram illustrating the configuration of a differential amplifier circuit using an active inductance circuit with variable inductance value as a load according to the sixth embodiment of the present invention.
Figure 11:
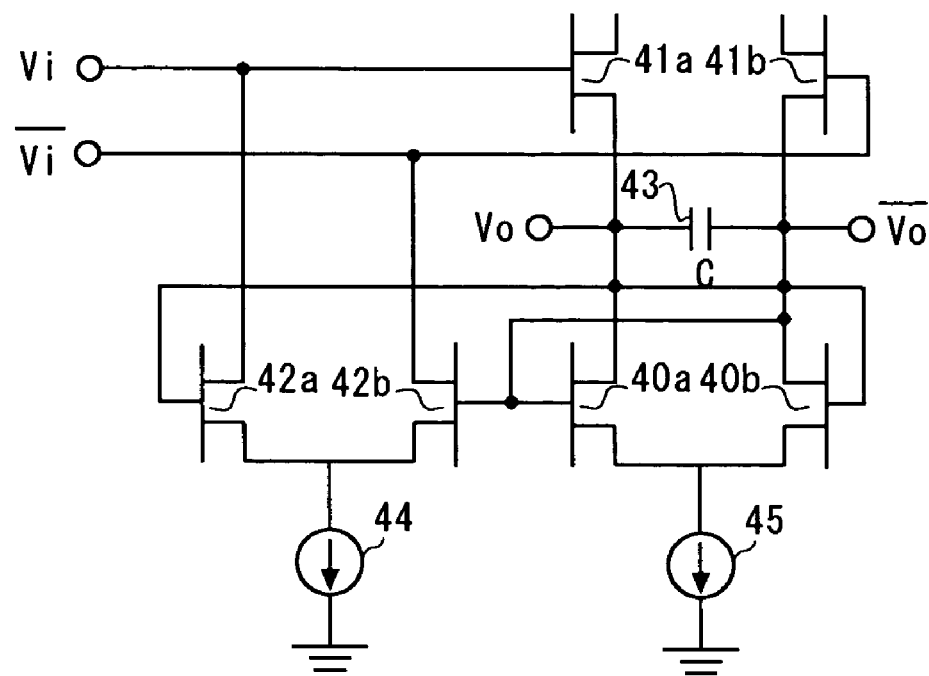
FIG. 11 is a circuit diagram illustrating the configuration of an active inductance circuit according to a conventional technique.

FIG. 10 is a circuit diagram illustrating the configuration of the differential amplifier circuit of the sixth embodiment. In the differential amplifier circuit of the present embodiment, the two capacitors 3 in respective active conductors 10a and 10b of the differential amplifier circuit of the second embodiment that has been explained with reference to FIG. 3 are replaced with variable capacitors 30a and 30b. The variable capacitors 30a and 30b are connected to a control terminal Vc for inputting a control signal. Changing capacitance values of capacitors 30a and 30b changes $g_{m,M2}$ of formula (11) and the impedance characteristic of active inductors 10a and 10b changes accordingly.

Controlling the variable capacitors 30a, 30b by the control signal makes it possible to control effectively the impedance characteristic of active inductors 10a and 10b. For example, employing multistage connection of the differential amplifier circuits of the present embodiment makes it possible to obtain a ring oscillator. Applying adequate control signals to the control terminal Vc of capacitors 30a and 30b makes it possible to realize a VCO with good high-frequency characteristic.

Thus, the present invention can provide an active inductance circuit that can operate at a high speed and a low voltage.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An active inductance circuit in which voltage and current characteristics at an output terminal represent characteristics of the circuit including inductance, comprising:
   a first transistor comprising a control terminal, a first signal terminal, and a second signal terminal;
   a second transistor different in conductivity type from the first transistor, comprising a control terminal, a first signal terminal, and a second signal terminal;
   a capacitor; and
   a current source,
   wherein the first signal terminal of the first transistor is connected to the output terminal;
   the control terminal of the second transistor is connected to the first signal terminal of the first transistor;
   the control terminal of the first transistor is connected to the second signal terminal of the second transistor; and
   the second signal terminal of the second transistor is connected to a terminal of the current source and a terminal of the capacitor.

2. An active inductance circuit according to claim 1, wherein the first and second transistors are MOS transistors, the control terminal is a gate terminal, the first terminal is a drain terminal, and the second terminal is a source terminal.

3. An active inductance circuit according to claim 1, wherein the first transistor is a PMOS transistor and the second transistor is an NMOS transistor.

4. An active inductance circuit according to claim 2, wherein the first transistor is a PMOS transistor and the second transistor is an NMOS transistor.

5. An active inductance circuit according to claim 1, wherein the first transistor is an NMOS transistor and the second transistor is a PMOS transistor.

6. An active inductance circuit according to claim 1, wherein
   the second signal terminal of the first transistor and the first signal terminal of the second transistor are connected to a first power source, and
   another terminal of the current source and another terminal of the capacitor are connected to a second power source.

7. An active inductance circuit according to claim 1, further comprising a second capacitor connected in parallel with the first transistor.

8. An active inductance circuit according to claim 1, wherein the capacitor is a variable capacitor controlled with a control signal.

9. An active inductance circuit according to claim 1, wherein an electric current value of the current source is controlled with a control signal.

10. A differential amplifier circuit comprising:
    a first active inductance circuit;
    a second active inductance circuit; and
    a differential pair comprising a first transistor and a second transistor; wherein control terminals of the first and second transistors are input terminals for differential signals,
    output terminals of the first and second active inductance circuits are connected to first signal terminals of the first and second transistors respectively;
    the first signal terminals of the first and second transistors are differential signal output terminals,
    second signal terminals of the first and second transistors are connected to a current source,
    each of the first and second active inductance circuits comprises a third transistor comprising a control terminal, a first signal terminal, and a second signal terminal; a fourth transistor different in conductivity type from the third transistor, comprising a control terminal, a first signal terminal, and a second signal terminal; a capacitor; and a second current source,
    the first signal terminal of the third transistor is connected to an output terminal,
    the control terminal of the fourth transistor is connected to the first signal terminal of the third transistor,
    the control terminal of the third transistor is connected to the second signal terminal of the fourth transistor, and
    the second signal terminal of the fourth transistor is connected to a terminal of the second current source and a terminal of the capacitor.

11. A differential amplifier circuit according to claim 10, wherein the first, second, third, and fourth transistors are MOS transistors, the control terminal is a gate terminal, the first terminal is a drain terminal, and the second terminal is a source terminal.

12. A differential amplifier circuit according to claim 11, wherein
    the current source comprises a third current source connected to the source terminal of the first transistor and a fourth current source connected to the source terminal of the second transistor, and an impedance element is connected between the source terminals of the first and second transistors.

13. A differential amplifier circuit according to claim 12, wherein the impedance element is constituted by a capacitor.

14. A differential amplifier circuit according to claim 12, wherein each of the first and second active inductance circuits comprises a third capacitor connected in parallel with the third transistor.

* * * * *